United States Patent
Thei et al.

(10) Patent No.: US 8,324,046 B2
(45) Date of Patent: Dec. 4, 2012

(54) POLY RESISTOR AND POLY EFUSE DESIGN FOR REPLACEMENT GATE TECHNOLOGY

(75) Inventors: Kong-Beng Thei, Hsin-Chu (TW); Harry Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/174,368

(22) Filed: Jun. 30, 2011

(65) Prior Publication Data

US 2011/0256677 A1 Oct. 20, 2011

Related U.S. Application Data

(63) Continuation of application No. 12/201,602, filed on Aug. 29, 2008, now Pat. No. 7,977,754.

(60) Provisional application No. 61/083,718, filed on Jul. 25, 2008.

(51) Int. Cl.
*H01L 21/8234* (2006.01)

(52) U.S. Cl. .. 438/238; 438/382; 438/443; 257/E21.004

(58) Field of Classification Search .................. 438/238, 438/382, 443; 257/E21.004
See application file for complete search history.

(56) References Cited

U.S. PATENT DOCUMENTS

| 6,011,712 | A | 1/2000 | Lee |
| 6,406,956 | B1 | 6/2002 | Tsai et al. |
| 6,774,439 | B2 | 8/2004 | Fukuzumi et al. |
| 7,098,721 | B2 | 8/2006 | Ouellette et al. |
| 7,144,784 | B2 | 12/2006 | Min et al. |
| 7,803,681 | B2 * | 9/2010 | Kim .............................. 438/259 |
| 2007/0099326 | A1 | 5/2007 | Hsu et al. |
| 2008/0206939 | A1 | 8/2008 | Min et al. |
| 2009/0051008 | A1 | 2/2009 | Shin et al. |
| 2010/0224941 | A1 | 9/2010 | Uejima et al. |

OTHER PUBLICATIONS

Chinese Patent Office, Office Action dated Jun. 4, 2010, Application No. 200910160469.0, 5 pages.

* cited by examiner

*Primary Examiner* — Trung Q Dang
(74) *Attorney, Agent, or Firm* — Haynes and Boone, LLP

(57) ABSTRACT

Methods for fabricating a semiconductor device are disclosed. In an example, a method includes forming an isolation region on a substrate, wherein the isolation region extends a depth into the substrate from a substrate surface; forming a recess in the isolation region, wherein the recess is defined by a concave surface of the isolation region; and forming a first gate structure over the substrate surface and a second gate structure over the concave surface of the isolation region.

18 Claims, 15 Drawing Sheets

POLY RESISTOR AND POLY EFUSE DESIGN FOR REPLACEMENT GATE TECHNOLOGY

CROSS-REFERENCE TO RELATED APPLICATIONS

This application is a continuation of U.S. patent application Ser. No. 12/201,602, filed on Aug. 29, 2008, issued as U.S. Pat. No. 7,977,754, which claims priority to Provisional Application Ser. No. 61/083,718 filed on Jul. 25, 2008, the entire disclosures of which are incorporated herein by reference in their entirety.

BACKGROUND

Polysilicon resistors are widely used in conventional integrated circuit design, including for RC oscillators, current limitation resistance, ESD protect, RF post drivers, on-chip termination, impedance matching, etc. For replacement gate technology, the polysilicon resistor typically includes a silicide region, which exhibits lower than desirable resistivity, and accordingly requires higher than desirable area overhead. A single crystalline silicon resistor (e.g., a resistor formed in a semiconductor substrate) has been proposed to resolve this issue, however, the single crystalline silicon resistor fails to provide precise impedance matching and capacitance for analog circuits, such as radio frequency and mixed-mode circuits.

Polysilicon electronic fuses (eFuses) are widely used in conventional memory integrated circuit design. See, e.g., U.S. Pat. No. 7,098,721 B1, entitled "Low Voltage Programmable eFuse with Differential Sensing Scheme" issued to Ouellette et al., and U.S. Publication No. 2007/0099326 A1, entitled "eFuse and Methods of Manufacturing the Same" issued to Hsu et al., which are hereby incorporated by reference. Similarly, for replacement gate technology, the polysilicon eFuse exhibits lower than desirable resistivity. Contact, via, and copper metal has been proposed to resolve this issue, however, such proposals fail to address programming voltage issues, for example, the need to lower the programming voltage while maintaining a high resistance.

Accordingly, what is needed are semiconductor devices that addresses the above stated issues, and methods for making such semiconductor devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for only illustration purposes. In fact, the dimensions of the various features may be arbitrarily increased or reduced for clarity of discussion.

DETAILED DESCRIPTION

Figure 1:
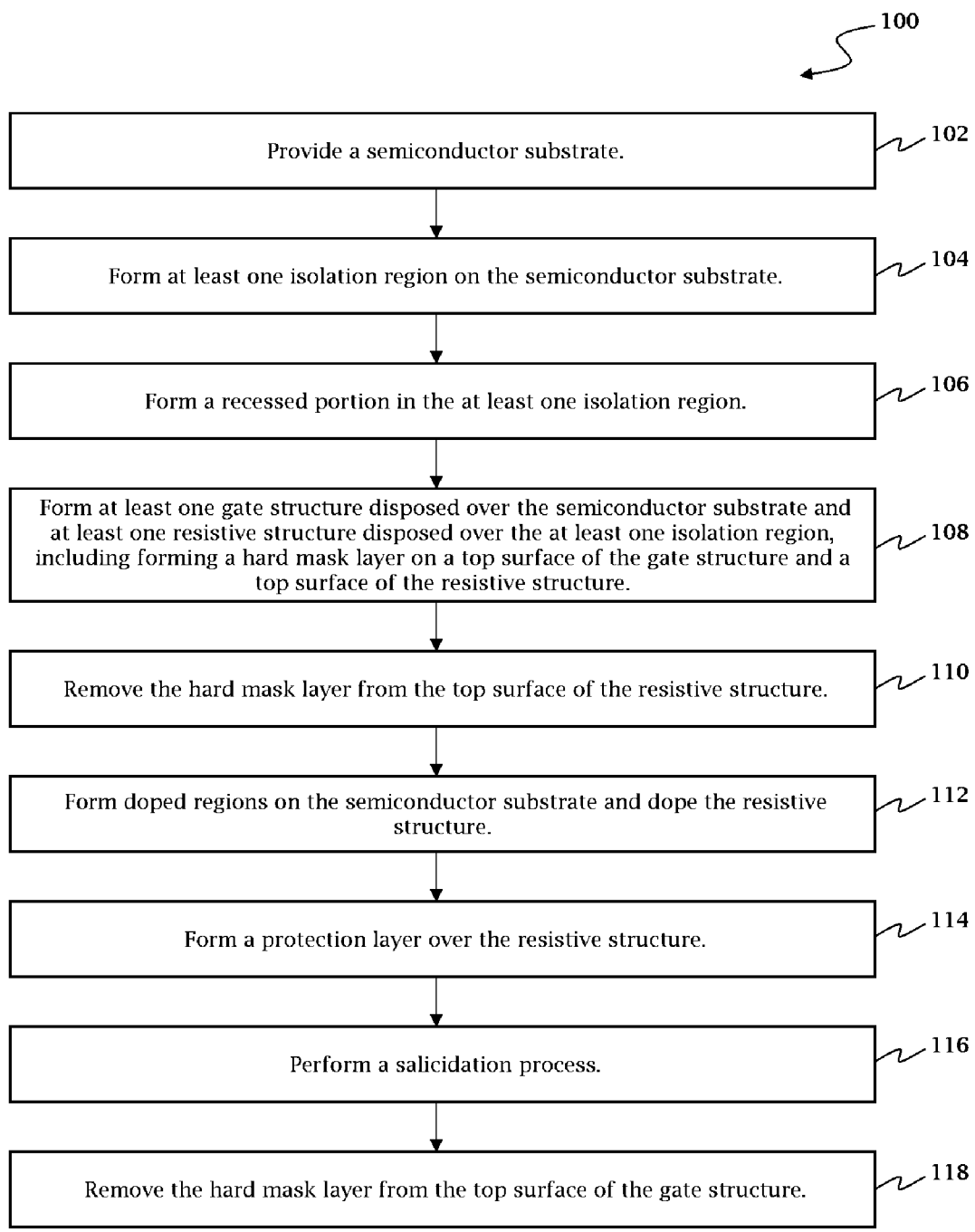
FIG. 1 is a flow chart of a method for forming a semiconductor device according to aspects of the present invention.

The present disclosure relates generally to the field of semiconductor devices, and more particularly, to a method for fabricating a semiconductor device including a resistive structure with increased resistivity and reduced area size.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 9:
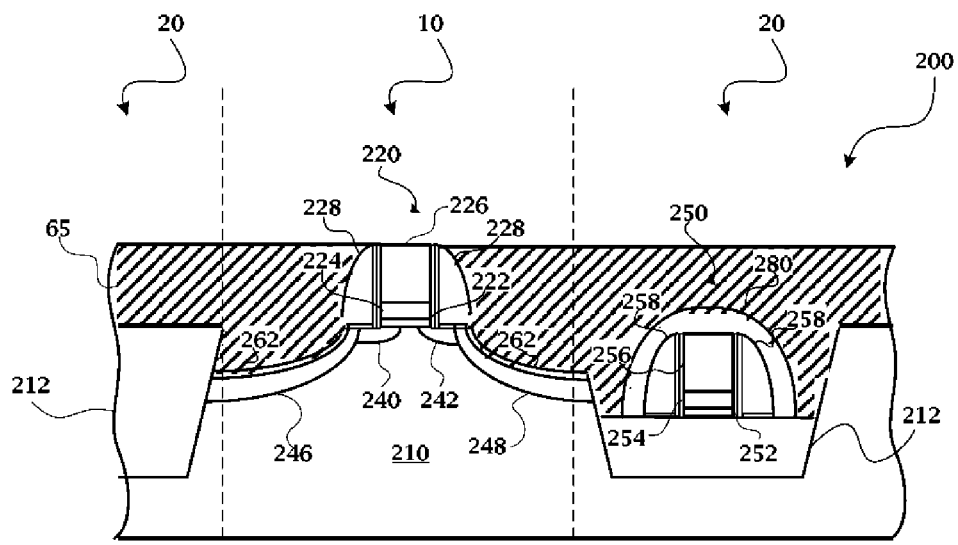
Figure 10:
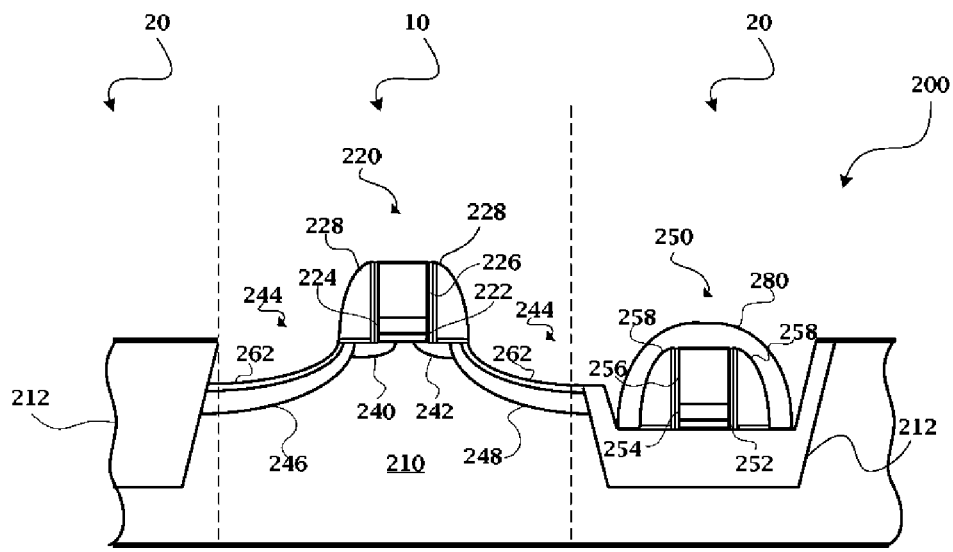
Figure 11:
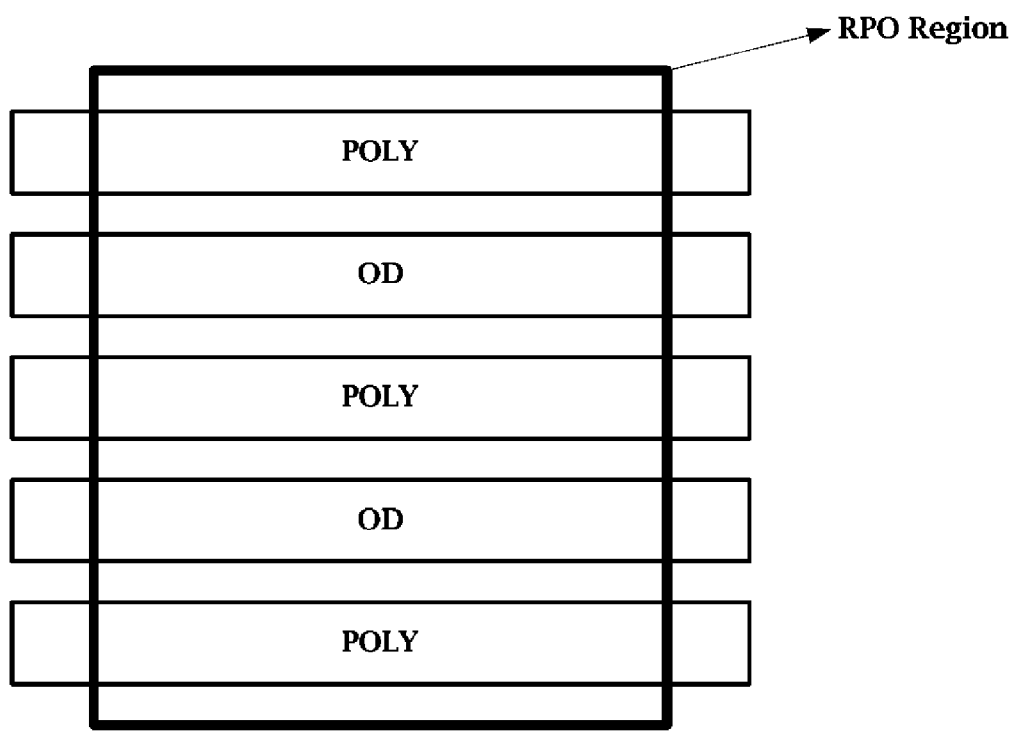
FIG. 11 is a cross-sectional view of one embodiment of a resistor according to aspects of the present invention.
Figure 12:
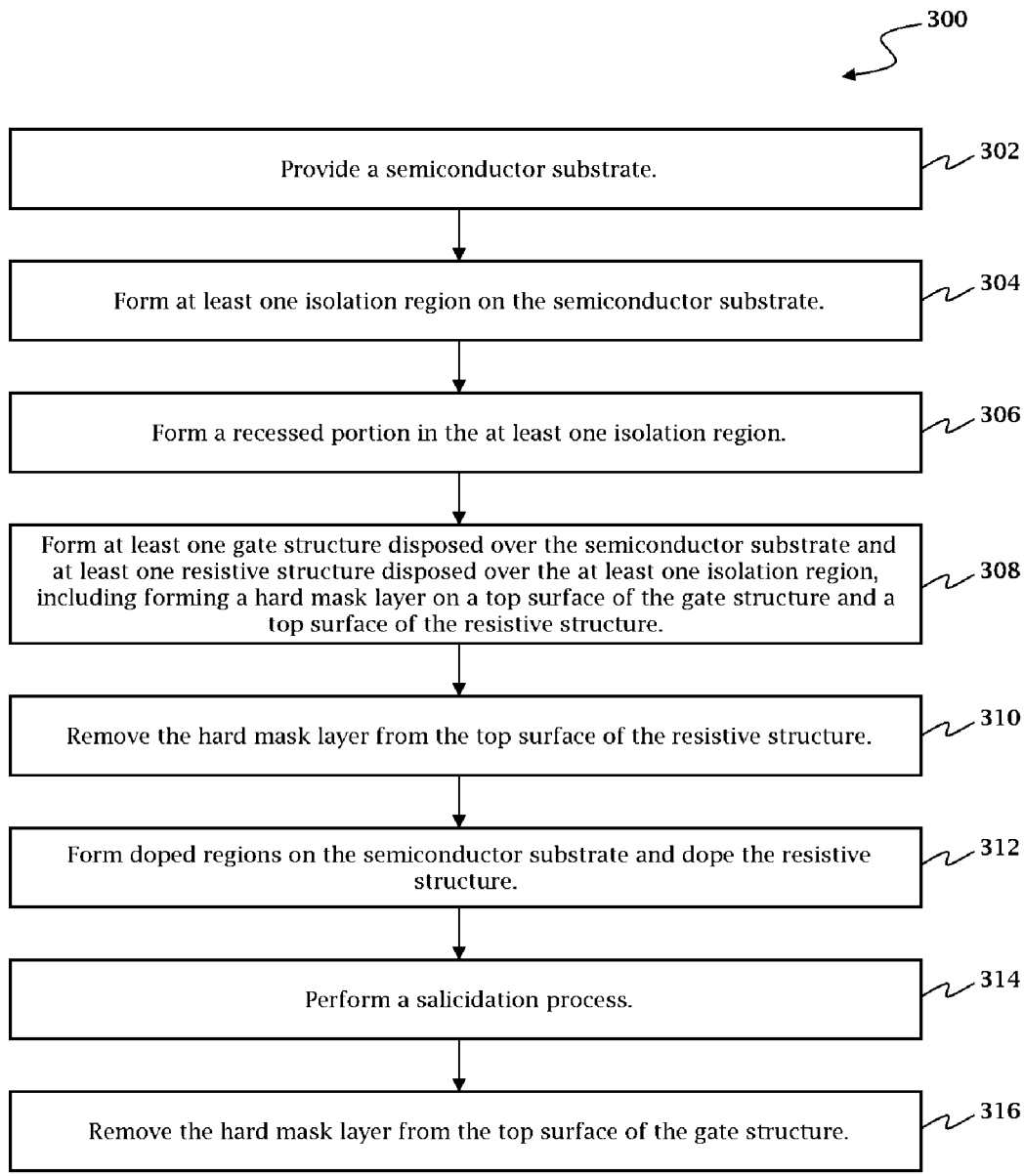
FIG. 12 is a flow chart of a method for forming a semiconductor device according to aspects of the present invention.
Figure 20:
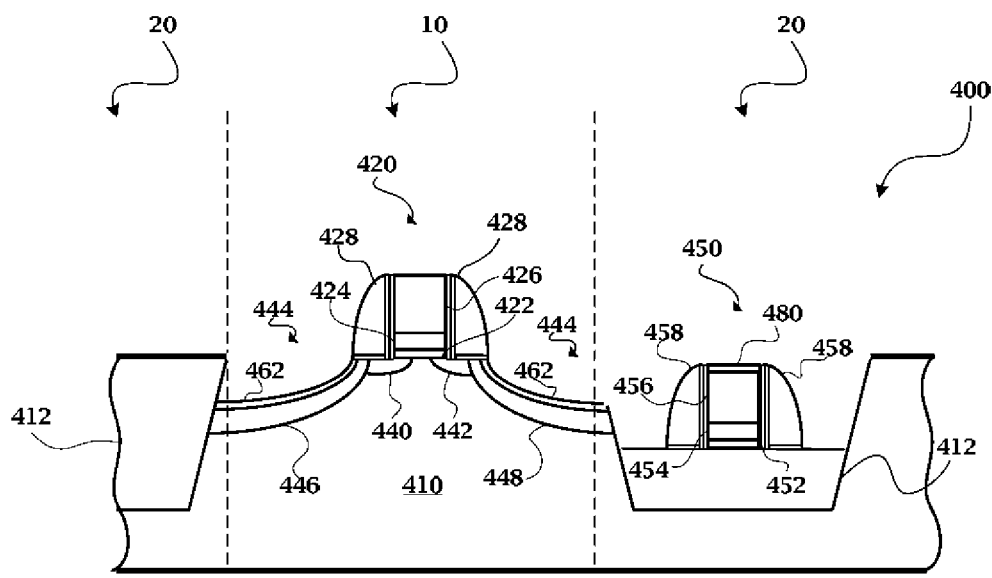
Figure 21A:
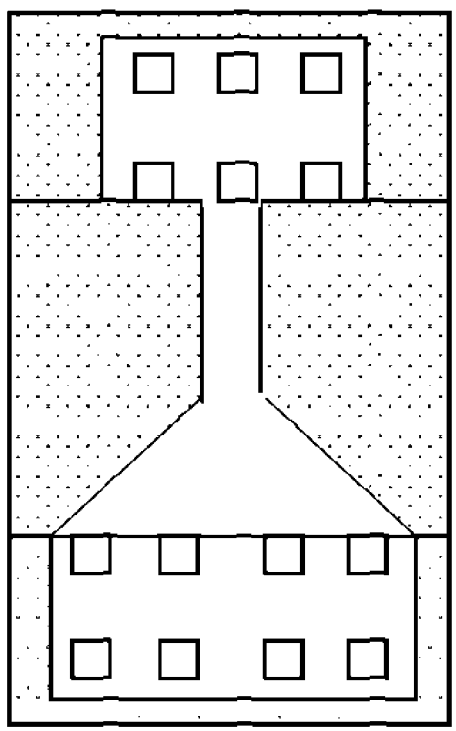
FIGS. 21A-21B are top view of various embodiments of an eFuse according to aspects of the present invention.
Figure 21B:
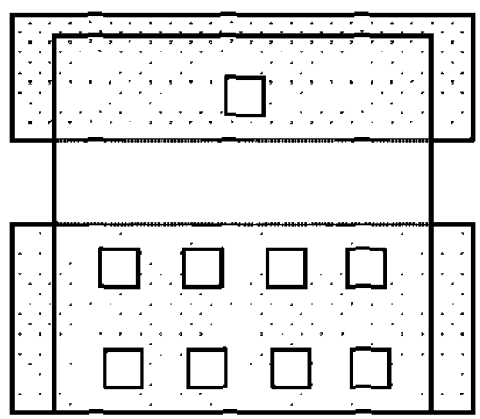

With reference to FIGS. 1 through 11, a method 100 and a semiconductor device 200 are collectively described below. FIG. 1 is a flow chart of one embodiment of the method 100 for making the semiconductor device 200. FIGS. 2-10 are various cross-sectional views of the semiconductor device 200 according to one embodiment, in portion or entirety, during various fabrication stages of the method 100. FIG. 11 is a cross-sectional view of one embodiment of a resistor according to aspects of the present invention. With reference to FIGS. 12 through 21B, a method 300 and a semiconductor device 400 are collectively described below. FIG. 12 is a flow chart of one embodiment of the method 300 for making the semiconductor device 400. FIGS. 13-20 are various cross-sectional views of the semiconductor device 400 according to one embodiment, in portion or entirety, during various fabrication stages of the method 400. FIGS. 21A-21B are cross-sectional view of various embodiments of an eFuse according to aspects of the present invention.

It is understood that additional steps can be provided before, during, and after the methods 100 and 300, and some of the steps described below can be replaced or eliminated, for additional embodiments of the methods. It is further understood that additional features can be added in the semiconductor devices 200 and 400, and some of the features described below can be replaced or eliminated, for additional embodiments of the semiconductor devices 200 and 400. The present embodiment of methods 100 and 300, and semiconductor devices 200 and 400, provides a novel resistive structure for replacement gate technology, which exhibits increased resistivity while providing reduced area impact.

Figure 2:
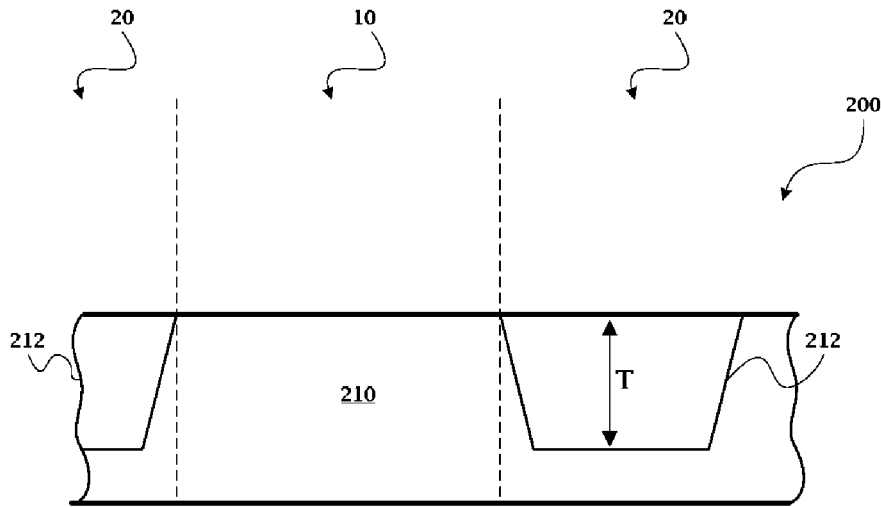
FIGS. 2-10 are various cross-sectional views of embodiments of a semiconductor device during various fabrication stages made by the method of FIG. 1.

The method 100 and semiconductor device 200 provide a novel polysilicon resistor design for replacement gate technology. Referring to FIGS. 1 and 2, the method 100 begins at step 102 wherein a semiconductor substrate 210 is provided. The semiconductor substrate 210 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; or an alloy semiconductor including SiGe, GaAsP, AlInAs, AlGaAs, GaInAs, GaInP, and GaIn- AsP; or any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure.

The semiconductor substrate 210 includes at least one active region 10 and at least one passive region 20. The active region 10 may include a variety of active microelectronic devices in various embodiments, such as P-channel field effect transistors (PFETs), N-channel field effect transistors (NFETs), metal-oxide semiconductor field effect transistors (MOSFETs), complementary metal-oxide semiconductor transistors (CMOSs), bipolar transistors, high voltage transistors, high frequency transistors, memory cells, other suitable active devices, and/or combinations thereof. The passive region 20 may include a variety of passive microelectronic devices in various embodiments, such as resistors, capacitors, inductors, fuses, other suitable components, and/or combinations thereof. The passive region 20 may further include at least one isolation region to define and electrically isolate the various active regions, such as field oxide regions. In the present embodiment, the method 100 will form a metal gate transistor within the active region 10 and a resistor within the passive region 20.

The method 100 proceeds to step 104, wherein at least one isolation region 212 is formed on the semiconductor substrate 210 within the at least one passive region 20. The isolation region 212 may utilize isolation technology, such as local oxidation of silicon (LOCOS) or shallow trench isolation (STI), to define and electrically isolate the various active regions 20. In the present embodiment, the isolation region 212 includes a STI, wherein the STI comprises a thickness, T. The thickness, T, may be between approximately 1500 Å and 4500 Å.

The isolation region 212, and in the present embodiment, the STI, may be formed by any suitable process. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material, such as silicon oxide, silicon nitride, silicon oxynitride, fluoride-doped silicate glass (FSG), a low-K dielectric material, other suitable materials, and/or combinations thereof. In some embodiments, the filled trench may have a multi-layer structure such as a thermal oxide liner layer filled with silicon nitride or silicon oxide. In another example, the STI may be created using a processing sequence as follows: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

Figure 3:
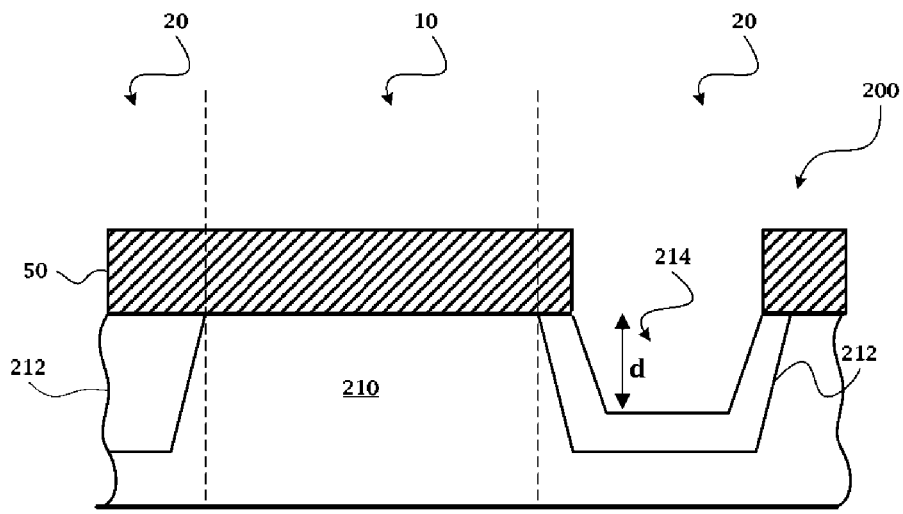

Referring to FIGS. 1 and 3, the method 100 proceeds to step 106 by forming a recess 214 in the isolation region 212. The recess 214 forms a distance, d, between a top surface of the semiconductor substrate 210 and a top surface of the isolation region 212. In some embodiments, d ranges between ten percent of the thickness of the isolation region 212 and 70% of the thickness of the isolation region 212 (i.e., $0.10T \leq d \leq 0.70T$). In some embodiments, d ranges between approximately 200 Å and 2000 Å.

The recess 214 may be formed by any suitable process. For example, forming the recess 214 may include patterning the semiconductor device 200 by a conventional process, such as forming a photoresist layer 50 over the semiconductor substrate 210 and isolation region 212; patterning the photoresist layer 50 by a conventional photolithography process, wherein only the isolation region 212 is exposed; and etching a recess 214 in the isolation region 212. The etching process may use one or more etching steps, and may be dry etching, wet etching, and/or other etching methods (e.g., reactive ion etching). The etching process may be either purely chemical (plasma etching), purely physical (ion milling), and/or combinations thereof. It is understood that the etching process may be tuned to result in varying isolation region 212 profiles. For example, after a wet etching process, the isolation region 412 may have a concave shape. In alternate embodiments, the isolation region 412 may have a profile comprising any shape, such as a convex shape. Further, in some embodiments, the etching process may result in a profile including sidewalls. In yet other embodiments, the etching process may result in a recessed, planar surface.

Figure 4:
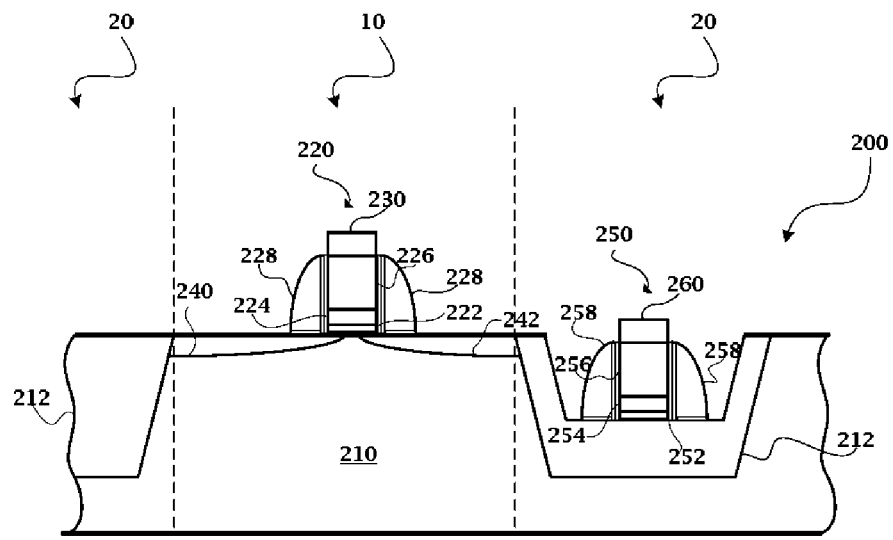

Referring to FIGS. 1 and 4, the method 100 proceeds to step 108 by forming at least one gate structure 220 within active region 10; forming lightly doped regions 240, 242 within active region 10; and forming at least one resistive structure 250 within passive region 20. The gate structure 220 and the resistive structure 250 may include a single layer or multiple layers. In the present embodiment, the gate structure 220 includes a gate dielectric layer 222, a gate electrode comprising a first gate layer 224 and a second gate layer 226, gate spacers 228, and a hard mask layer 230. The resistive structure 250 includes a dielectric layer 252, an electrode comprising a first layer 254 and a second layer 256, spacers 258, and a hard mask layer 260. It is understood that a plurality of gate structures 220 and resistive structures 250 may be formed.

The gate structure 220 is disposed over the substrate 210, and the resistive structure 250 is disposed over the isolation region 212. The gate structure 220 and the resistive structure 250 may lie in substantially different planes, i.e., a top surface of the gate structure 220 is not level with a top surface of the resistive structure 250. In the present embodiment, because the resistive structure 250 is disposed over the isolation region 212 including the recess 214, the top surface of the resistive structure 250 is lower than the top surface of the gate structure 220. In some embodiments, the top surface of the resistive structure 250 may be lower than the top surface of the gate structure 220 by at least 250 Å. In alternate embodiments, the top surface of the resistive structure 250 may be higher than the top surface of the gate structure 220.

It is understood that the gate structure 220 and the resistive structure 250 may be formed simultaneously, utilizing the same processing steps and processing materials; the gate structure 220 and the resistive structure 250 may be formed independently of one another, utilizing varying processing steps and processing materials; or the gate structure 220 and the resistive structure 250 may be formed using a combination of simultaneous and independent processing steps and processing materials. Further, the gate structure 220 and the resistive structure 250 may be formed by a damascene and/or dual damascene technique. The gate structure 220 and the resistive structure 250 may comprise any suitable shape. For example, the resistive structure 250 may comprise the shape of a line, dog bone, rectangle, other suitable shapes, and/or combinations thereof. It is also understood that the gate structure 220 and resistive structure 250 may comprise multiple gate structures 220 or resistive structures 250. In some embodiments, the resistive structure 250 may include a discrete resistor. In some embodiments, the resistive structure 250 may comprise a resistor array. In some embodiments, the resistive structure 250 may comprise a silicon resistor.

The gate dielectric layer 222 is disposed on the semiconductor substrate 210, and the dielectric layer 252 is disposed on the isolation region 212. The gate dielectric layer 222 and dielectric layer 252 may be any suitable dielectric material. The dielectric layers 222, 252 may further include a multilayer structure comprising multiple dielectric materials. Preferably, the dielectric material will have relatively high integrity and low current leakage. In the present embodiment, the gate dielectric layer 222 and the dielectric layer 252 comprise a high-K dielectric material. The high k material may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, and/or combinations thereof. Examples of the dielectric material further include silicon oxide, silicon nitride, silicon oxynitride, hafnium oxide, zirconium oxide, titanium oxide, aluminum oxide, hafnium dioxide-alumina ($HfO_2$—$Al_2O_3$) alloy, other suitable high-K dielectric materials, and/or combinations thereof. In some embodiments, the gate dielectric layer 222 and the dielectric layer 252 may comprise a layer of silicon dioxide and a layer of high-K dielectric material. Further, the dielectric layers 222, 252 may be doped polycrystalline silicon with the same or different doping. The dielectric layers 222, 252 may be formed using chemical vapor deposition (CVD), physical vapor deposition (PVD), atomic layer deposition (ALD), thermal oxide, plating, other suitable processes, and/or combinations thereof.

The gate electrode comprising the first gate layer 224 and the second gate layer 226 is disposed over the gate dielectric layer 222. The electrode comprising the first layer 254 and the second layer 256 is disposed over the dielectric layer 252. The gate electrode and electrode may comprise polycrystalline silicon; silicon-containing materials; germanium-containing materials; metal, such as aluminum, copper, tungsten, titanium, tantalum, titanium nitride, tantalum nitride, nickel silicide, cobalt silicide; other proper conductive materials; and combinations thereof. In the present embodiment, the first gate layer 224 and the first layer 254 comprise metal, such as aluminum, copper, tungsten, titanium, tantalum, titanium nitride, tantalum nitride, nickel silicide, cobalt silicide; and the second gate layer 226 and the second layer 256 comprise polycrystalline silicon (i.e., polysilicon). It is understood that in alternate embodiments, the first gate layer 224, first layer 254, second gate layer 226, and second layer 256 may comprise other suitable materials and may comprise multilayer structures. The gate electrode and electrode may be formed by CVD, PVD, ALD, thermal oxide, plating, other suitable processes, and/or combinations thereof.

The gate spacers 228, which are positioned on each side of the gate structure 220, and the spacers 258, which are positioned on each side of the resistive structure 250, may comprise a dielectric material such as silicon nitride, silicon oxide, silicon carbide, silicon oxynitride, other suitable materials, or combinations thereof. In some embodiments, the gate spacers 228 and spacers 258 may comprise a multilayer structure. The spacers 228, 258 may be formed by depositing the dielectric material by CVD, ALD, PVD, and/or other suitable processes and then etching.

As noted above, the gate structure 220 and the resistive structure 250 may be formed simultaneously. In some embodiments, a dielectric layer and electrode layer may be formed on the semiconductor substrate and isolation region and then patterned to form a plurality of gate structures and resistive structures using processes including photolithography patterning and etching. In one example, for patterning the dielectric layers and the electrode layers, a layer of photoresist is formed on the electrode layers by a suitable process, such as spin-on coating, and then patterned to form a patterned photoresist feature by a proper lithography patterning method. The pattern of the photoresist can then be transferred by a dry etching process to the underlying dielectric layers and electrode layers to form the electrode layers and dielectric layers of the gate structure and resistive structure as shown in FIG. 4. The photoresist layer may be stripped thereafter. In another example, a hard mask layer is formed on the electrode layers; the patterned photoresist layer is formed on the hard mask layer; the pattern of the photoresist layer is transferred to the hard mask layer and then transferred to the electrode layers to form the electrode layers and dielectric layers of the gate structure and resistive structure. It is understood that the above examples do not limit the processing steps that may be utilized to form the gate structure 220 and the resistive structure 250.

In the present embodiment, the hard mask layers 230, 260 are disposed over the gate electrode 226 and the second layer 256, respectively. In the present embodiment, the hard mask layers 230, 260 comprise a nitrogen-containing material, such as silicon nitride, silicon oxynitride, other suitable nitrogen-containing materials, and/or combinations thereof. In alternate embodiments, the hard mask layers may include an amorphous carbon material, silicon carbide, other suitable dielectric materials, and/or combinations thereof. The hard mask layers 230, 260 may be formed by any suitable process, such as PVD, CVD, plasma-enhanced CVD, rapid thermal CVD, ALD, metal-organic CVD, other suitable processes, and/or combinations thereof. The hard mask layers 230, 260 may include a single layer or multiple layers. Further, the hard mask layers 230, 260 comprise any suitable thickness. In the present embodiment, the hard mask layers 230, 260 comprise a thickness of approximately 200 Å to 1000 Å. It is understood that the hard mask layers 230, 260 may comprise similar or different compositions, thicknesses, etc.

The lightly doped regions 240, 242 (also referred to as LDD regions) are formed in the semiconductor substrate 210 after the formation of the gate spacers 228. The LDD regions 240, 242 may be doped n-type and/or p-type and may comprise various doping profiles. The LDD regions 240, 242 are formed by any suitable process such as ion implantation.

Figure 5:
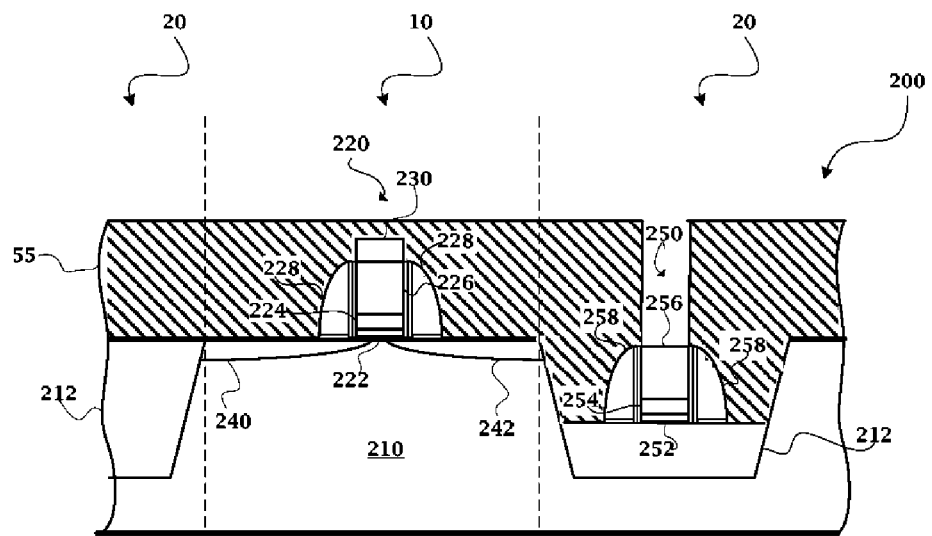

Referring to FIGS. 1 and 5, at step 110, the hard mask layer 260 disposed over the resistive structure 250 is removed. The hard mask layer 260 may be removed by any suitable process. For example, as illustrated in FIG. 5, removing the hard mask layer 260 may include forming a photoresist layer 55 over the semiconductor device 200; patterning the photoresist layer 55 by a conventional photolithography process; and etching the photoresist layer 55 to remove the hard mask layer 260. Subsequently, the photoresist layer 55 may be removed.

Figure 6A:
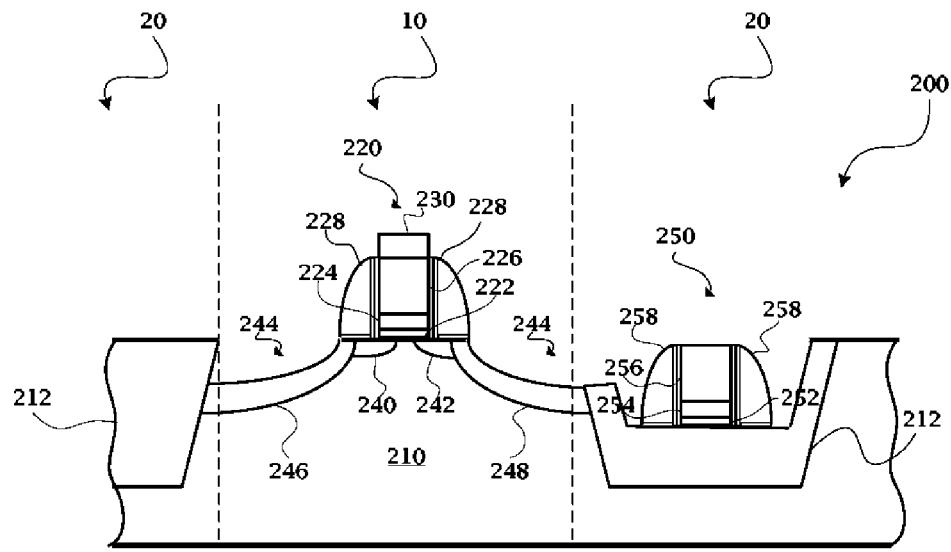
Figure 6B:
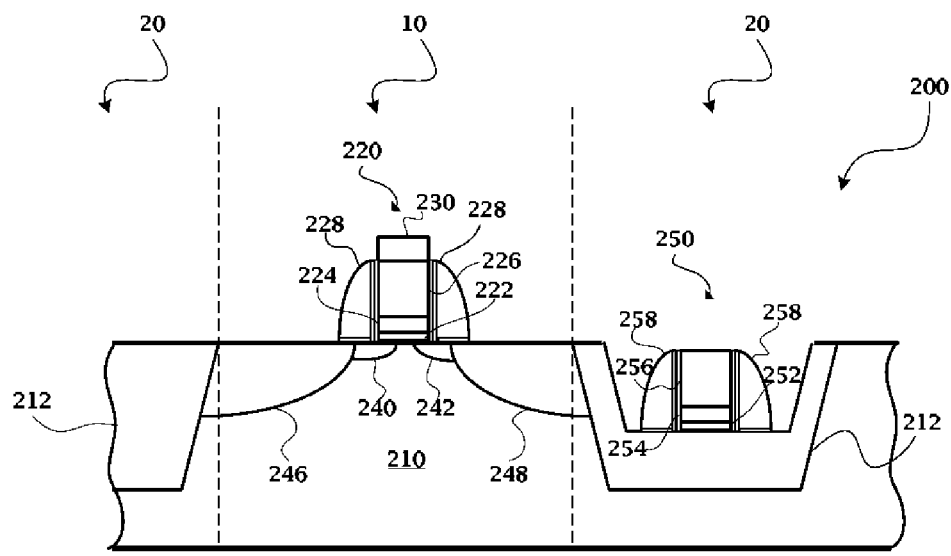

Referring to FIGS. 1 and 6A, at step 112, doped regions 246, 248 are formed and the electrode of the resistive structure 250 comprising the first layer 254 and second layer 256 is doped. The doped regions 246, 248 may be doped with p-type or n-type dopants. For example, the doped regions 246, 248 may be doped with p-type dopants, such as boron or $BF_2$. Alternatively, the doped regions 246, 248 may be doped with n-type dopants, such as phosphorus or arsenic. The doped regions 246, 248 may include a source and drain region. The source and drain regions may be formed directly on the semiconductor substrate 210, in a P-well structure, in a N-well structure, in a dual-well structure, or using a raised structure. The source and drain regions may comprise various doping profiles and may be formed by a plurality of ion implantation processes. Alternate embodiments may have only one doped region or multiple doped regions. The doped regions 246, 248 are formed by any suitable process, such as ion implantation and/or a rapid thermal process (RTP) to activate the doped regions. In the present embodiment, a recess 244 is formed in the doped regions 246, 248, wherein the doped regions 246, 248 are recessed from a top surface of the semiconductor substrate 210. The recess 244 may be formed by any suitable process. In some embodiments, the recess 244 is a distance from a top surface of the semiconductor substrate 210 to a top surface of the doped regions 246, 248. In one example, the distances from the top surface of the semiconductor substrate of the semiconductor substrate 210 and the top surface of the doped regions 246, 248 is at least 250 Å. It is understood that in some embodiments, as illustrated in FIG. 6B, the doped regions 246, 248 may not include recess 244, making the top surface of the semiconductor substrate 210 level with the top surface of the doped regions 246, 248.

Also, at step 112, the resistive structure 250, particularly the electrode of the resistive structure 250 including the first layer 254 and the second layer 256 is doped. The electrode may be doped with p-type or n-type dopants. For example, the electrode may be doped with p-type dopants, such as boron or $BF_2$. Alternatively, the electrode may be doped with n-type dopants, such as phosphorus or arsenic. In some embodiments, the resistive structure 250 may comprise doped polysilicon. In some embodiments, the resistive structure 250 may comprise doped amorphous silicon. The electrode of the resistive structure 250 may be doped by any suitable process including in-situ doping and/or ion implantation. In one example, the electrode may be doped while forming the doped regions 246, 248, such as performing a simultaneous ion implantation process. In other examples, the electrode may be doped independently from the doped regions 246, 248, such as independent photolithography patterning and etching processes to form the electrode and the doped regions 246, 248. Doping the electrode of the resistive structure 250 independently may provide more flexibility in tuning the resistivity of the resistive structure 250.

As discussed below, a salicidation process forms silicide regions in the doped regions 246, 248. Typically, a conventional resistive structure is also exposed to the salicidation process, forming a silicide region in the conventional resistive structure. However, a conventional resistive structure including a silicide region exhibits lower than desirable resistance and results in larger than desirable area overhead. Such conventional resistive structure poses additional disadvantages for analog circuits, such as radio frequency (RF) and mixed mode circuits, including the conventional resistive structure being unable to provide precise impedance and capacitance matching.

Figure 7A:
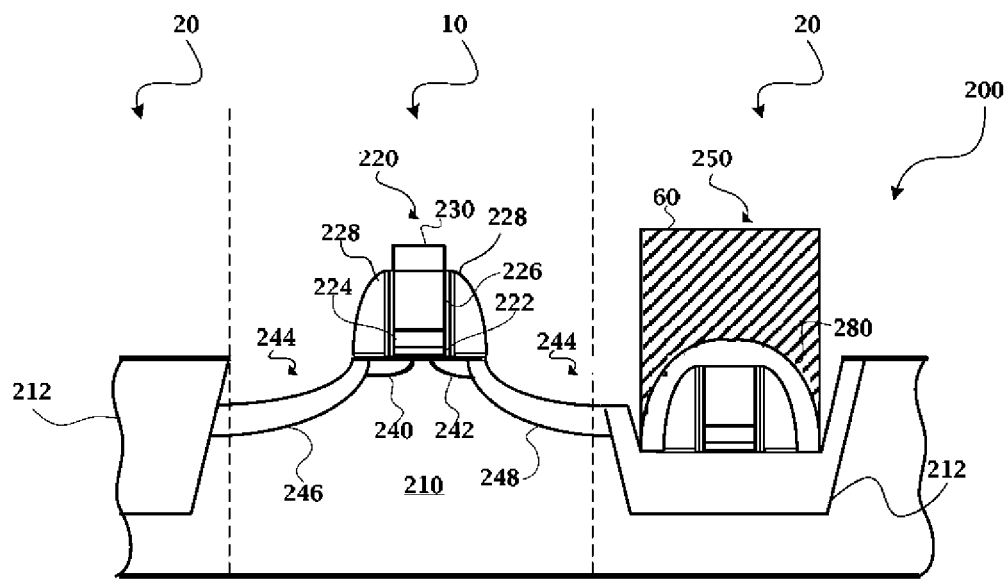
Figure 7B:
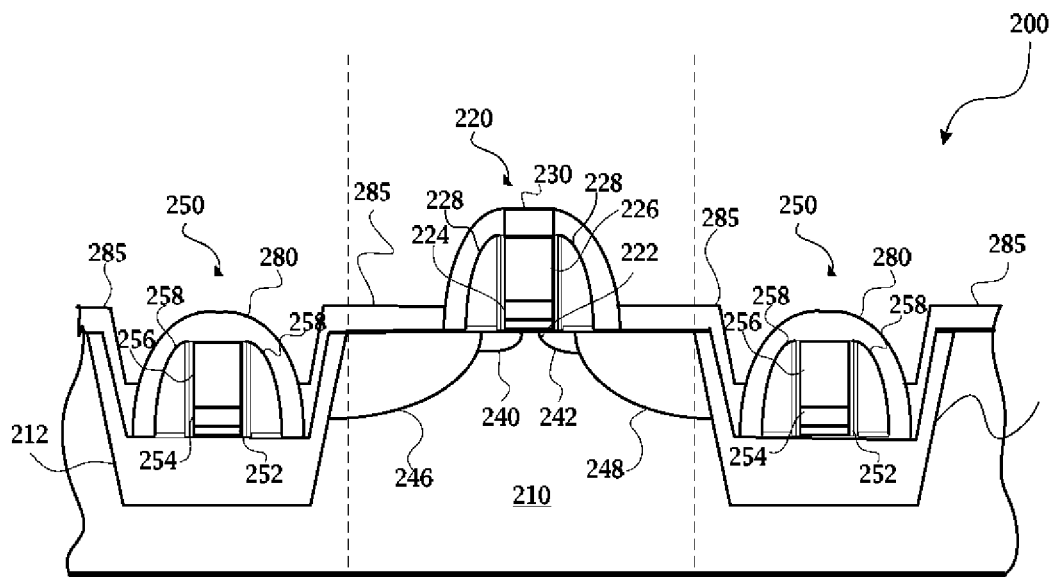

Accordingly, at step 114, referring to FIGS. 1 and 7A, a protection layer 280 is disposed over the resistive structure 250. The protection layer 280 may prevent a silicide region from forming in the resistive structure 250, specifically from forming a silicide region in the electrode comprising the first layer 254 and the second layer 256. Preventing a silicide region from forming in the resistive structure 250 provides increased resistivity, resulting in lower area overhead. The protection layer 280 may comprise any suitable material. In the present embodiment, the protection layer 280 comprises a resist protection oxide (RPO). The RPO may be a dielectric layer, such as an oxide layer, a nitride layer, an oxy-nitride layer, other suitable layers, and/or combinations thereof. The RPO may also include one or many different layers. In the present embodiment, the RPO includes silicon oxide and/or silicon nitride. The protective layer 280 may further comprise any suitable thickness. In some embodiments, the protective layer 280 comprises a thickness from approximately 300 Å and 1500 Å. Further, the protection layer 280 may be formed over the resistive structure by any suitable method. For example, as illustrated in FIG. 7A, forming the protection layer 280 may include forming a protection layer over the semiconductor device 200; forming a photoresist layer 60 over the protection layer; patterning the photoresist layer 60 by a conventional photolithography process; and etching the photoresist layer 60 and the protection layer to form protection layer 280. Subsequently, the photoresist layer 60 may be removed. In some embodiments, as shown in FIG. 7B, a polish stop layer 285 may be disposed over the semiconductor substrate 210 between the resistive structure 250 and the gate structure 220. The polish stop layer 285 may prevent or reduce the risk of over-polishing (or dishing) of the semiconductor substrate 210, doped regions 246, 248, and isolation region 212.

Figure 8A:
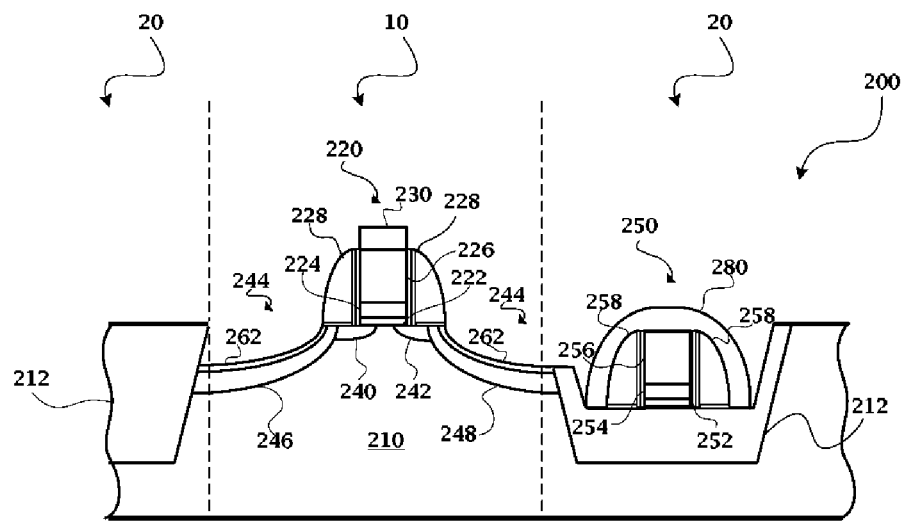
Figure 8B:
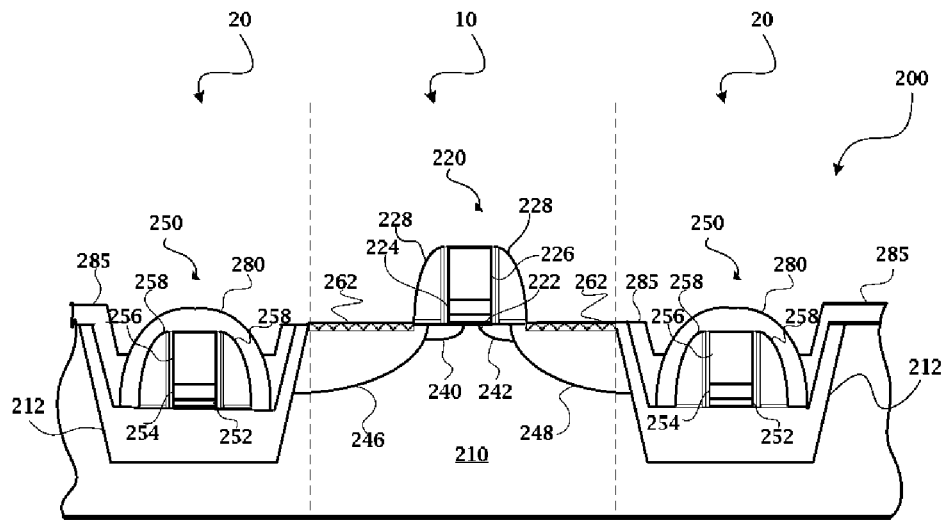

Referring to FIGS. 1 and 8A, at step 116, a silicide is formed in the doped regions 246, 248 to form doped silicide regions 262. The silicide may also be formed in the gate structure 220 to form a gate silicide region. It should be noted that the protection layer 280 disposed over resistive structure 250 prevents a silicide region from forming in the resistive structure 250, resulting in increased resistivity of the resistive structure 250, and accordingly reducing area overhead. In some embodiments, as shown in FIG. 8B, at step 116, a suitable process removes the polish stop layer 285 from the gate structure 220 and doped regions 246, 248, and then, a silicide is formed in the doped regions 246, 248 to form doped silicide regions 262.

The silicide regions 262 may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a rapid thermal annealing process (RTP). The reacted silicide may require a one step RTP or multiple step RTPs.

FIGS. 1 and 9 illustrate step 118, wherein the hard mask layer 230 is removed from the gate structure 220. It is understood that step 118 may occur before or after the salicidation process, depending on whether a silicide region needs to be formed in the gate structure 220. The hard mask layer 230 may be removed by any suitable process. For example, as illustrated in FIG. 9, removing the hard mask layer 230 may include forming a photoresist layer 65 over the semiconductor device 200; patterning the photoresist layer 65 by a conventional photolithography process; and etching the photoresist layer 65 to remove the hard mask layer 230. Subsequently, the photoresist layer 65 may be removed as illustrated in FIG. 10 and the semiconductor device 200 may be exposed to subsequent processing. FIG. 11 provides one embodiment of the resistive structure, wherein the resistive structure comprises a layered structure of polysilicon resistor (POLY) and active region resistor (OD) materials, including a protective region (RPO region).

The method 100 and semiconductor device 200, as illustrated in FIG. 10, provide a resistive structure 250 comprising a novel polysilicon resistor for replacement gate technology. Such silicide-free resistive structure, lying in a substantially different plane than the gate structure, provides a resistive structure with increased resistivity, lower overhead area, and improved impedance/capacitance matching.

Figure 13:
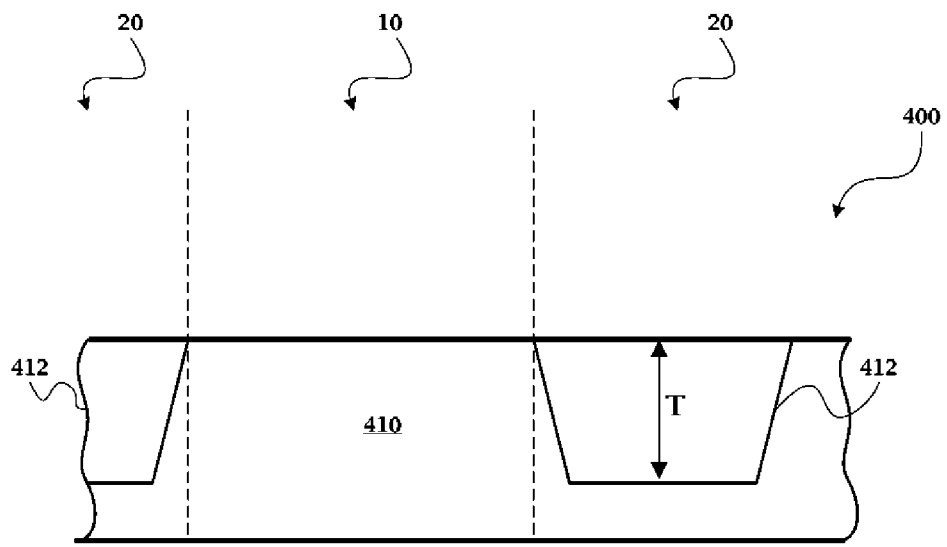
FIGS. 13-20 are various cross-sectional views of embodiments of a semiconductor device during various fabrication stages made by the method of FIG. 12.

The method 300 and semiconductor device 400 provide a novel polysilicon eFuse design for replacement gate technology. Referring to FIGS. 12 and 13, the method 300 begins at step 302 wherein a semiconductor substrate 410 is provided. The semiconductor substrate 410 may comprise an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; or an alloy semiconductor including SiGe, GaAsP, AlInAs, AlGaAs, GaInAs, GaInP, and GaInAsP; or any other suitable material; and/or combinations thereof. In one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epi layer or a buried layer. In other examples, the compound semiconductor substrate may have a multilayer structure, or the silicon substrate may include a multilayer compound semiconductor structure.

The semiconductor substrate 410 includes at least one active region 10 and at least one passive region 20. The active region 10 may include a variety of active microelectronic devices in various embodiments, such as P-channel field effect transistors (PFETs), N-channel field effect transistors (NFETs), metal-oxide semiconductor field effect transistors (MOSFETs), complementary metal-oxide semiconductor transistors (CMOSs), bipolar transistors, high voltage transistors, high frequency transistors, memory cells, other suitable active devices, and/or combinations thereof. The passive region 20 may include a variety of passive microelectronic devices in various embodiments, such as resistors, capacitors, inductors, fuses, other suitable components, and/or combinations thereof. The passive region 20 may further include at least one isolation region to define and electrically isolate the various active regions, such as field oxide regions. In the present embodiment, the method 300 will form a metal gate transistor within the active region 10 and an eFuse within the passive region 20.

The method 300 proceeds to step 304, wherein at least one isolation region 412 is formed on the semiconductor substrate 410 within the at least one passive region 20. The isolation region 412 may utilize isolation technology, such as local oxidation of silicon (LOCOS) or shallow trench isolation (STI), to define and electrically isolate the various active regions 20. In the present embodiment, the isolation region 412 includes a STI, wherein the STI comprises a thickness, T. The thickness, T, may be between approximately 1500 Å and 4500 Å.

The isolation region 412, and in the present embodiment, the STI, may be formed by any suitable process. As one example, the formation of an STI may include patterning the semiconductor substrate by a conventional photolithography process, etching a trench in the substrate (for example, by using a dry etching, wet etching, and/or plasma etching process), and filling the trench (for example, by using a chemical vapor deposition process) with a dielectric material, such as silicon oxide, silicon nitride, silicon oxynitride, fluoride-doped silicate glass (FSG), a low-K dielectric material, other suitable materials, and/or combinations thereof. In some embodiments, the filled trench may have a multi-layer structure such as a thermal oxide liner layer filled with silicon nitride or silicon oxide. In another example, the STI may be created using a processing sequence as follows: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical polishing (CMP) processing to etch back and planarize, and using a nitride stripping process to remove the silicon nitride.

Figure 14:
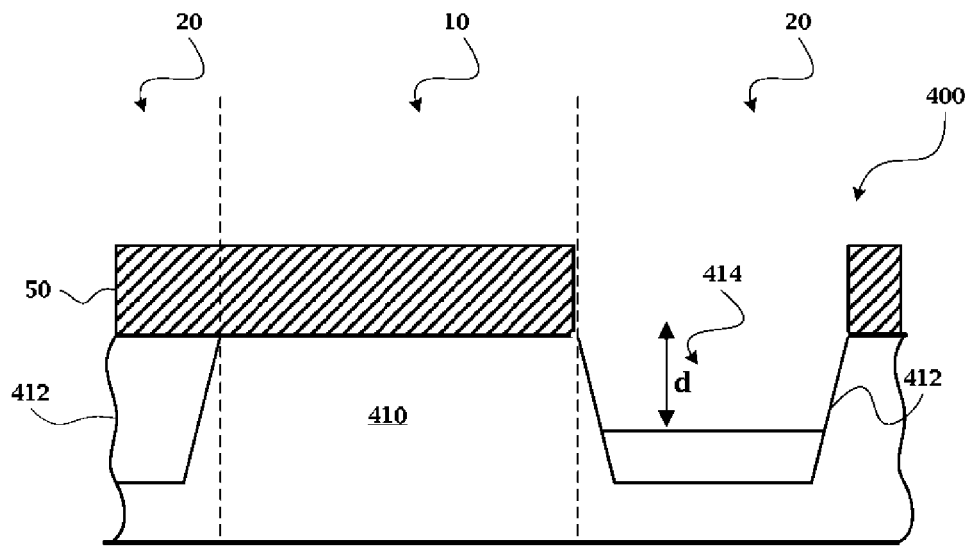

Referring to FIGS. 12 and 14, the method 300 proceeds to step 306 by forming a recess 414 in the isolation region 412. The recess 414 forms a distance, d, between a top surface of the semiconductor substrate 410 and a top surface of the isolation region 412. In some embodiments, d ranges between ten percent of the thickness of the isolation region 412 and 70% of the thickness of the isolation region 412 (i.e., $0.10T \leq d \leq 0.70T$). In some embodiments, d ranges between approximately 200 Å and 2000 Å.

The recess 414 may be formed by any suitable process. For example, forming the recess 414 may include pattering the semiconductor device 400 by a conventional process, such as forming a photoresist layer 50 over the semiconductor substrate 410 and isolation region 412; patterning the photoresist layer 50 by a conventional photolithography process, wherein only the isolation region 412 is exposed; and etching a recess 414 in the isolation region 412. The etching process may use one or more etching steps, and may be dry etching, wet etching, and/or other etching methods (e.g., reactive ion etching). The etching process may be either purely chemical (plasma etching), purely physical (ion milling), and/or combinations thereof. It is understood that the etching process may be tuned to result in varying isolation region 412 profiles. For example, after a wet etching process, the isolation region 412 may have a concave shape. In alternate embodiments, the isolation region 412 may have a profile comprising any shape, such as a convex shape. Further, in some embodiments, the etching process may result in a profile including sidewalls. In yet other embodiments, the etching process may result in a recessed, planar surface.

Figure 15:
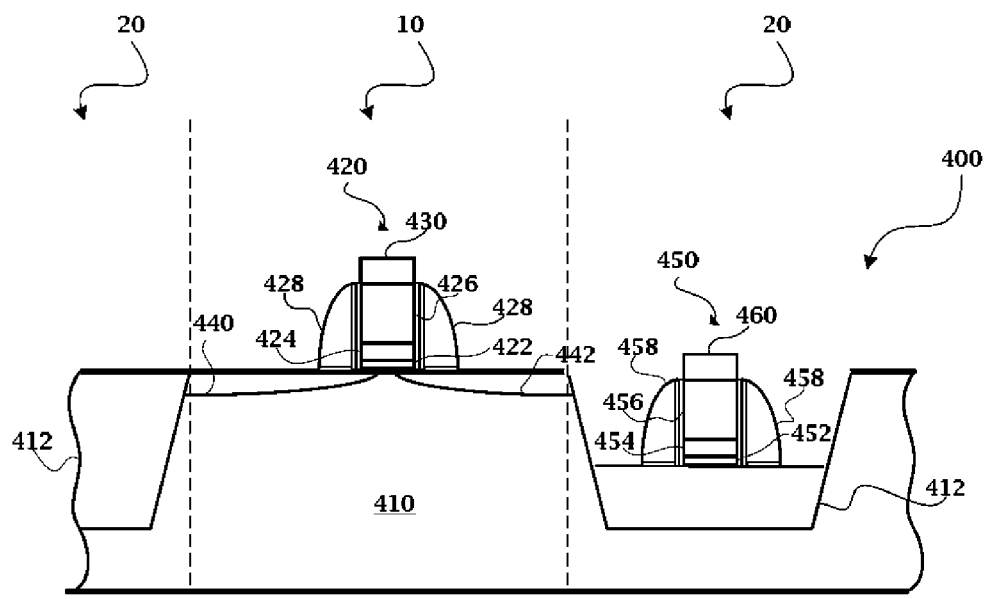

Referring to FIGS. 12 and 15, the method 300 proceeds to step 308 by forming at least one gate structure 420 within active region 10; forming lightly doped regions 440, 442 within active region 10; and forming at least one resistive structure 450 within passive region 20. The gate structure 420 and the resistive structure 450 may include a single layer or multiple layers. In the present embodiment, the gate structure 420 includes a gate dielectric layer 422, a gate electrode comprising a first gate layer 424 and a second gate layer 426, gate spacers 428, and a hard mask layer 430. The resistive structure 450 includes a dielectric layer 452, an electrode comprising a first layer 454 and a second layer 456, spacers 458, and a hard mask layer 460. It is understood that a plurality of gate structures 420 and resistive structures 450 may be formed.

The gate structure 420 is disposed over the substrate 410, and the resistive structure 450 is disposed over the isolation region 412. The gate structure 420 and the resistive structure 450 may lie in substantially different planes, i.e., a top surface of the gate structure 420 is not level with a top surface of the resistive structure 450. In the present embodiment, because the resistive structure 450 is disposed over the isolation region 412 including the recess 414, the top surface of the resistive structure 450 is lower than the top surface of the gate structure 420. In some embodiments, the top surface of the resistive structure 450 may be lower than the top surface of the gate structure 420 by at least 250 Å. In alternate embodiments, the top surface of the resistive structure 250 may be higher than the top surface of the gate structure 220.

It is understood that the gate structure 420 and the resistive structure 450 may be formed simultaneously, utilizing the same processing steps and processing materials; the gate structure 420 and the resistive structure 450 may be formed independently of one another, utilizing varying processing steps and processing materials; or the gate structure 420 and the resistive structure 450 may be formed using a combination of simultaneous and independent processing steps and processing materials. Further, the gate structure 420 and the resistive structure 450 may be formed by a damascene and/or dual damascene technique. The gate structure 420 and the resistive structure 450 may comprise any suitable shape. For example, the resistive structure 450 may comprise the shape of a line, dog bone, rectangle, other suitable shapes, and/or combinations thereof. It is also understood that the gate structure 420 and resistive structure 450 may comprise multiple gate structures 420 or resistive structures 450. In some embodiments, the resistive structure 250 may include a discrete eFuse. In some embodiments, the resistive structure 250 may comprise an eFuse array. In some embodiments, the resistive structure 250 may comprise a silicon eFuse.

The gate dielectric layer 422 is disposed on the semiconductor substrate 410, and the dielectric layer 452 is disposed on the isolation region 412. The gate dielectric layer 422 and dielectric layer 452 may be any suitable dielectric material. The dielectric layers 422, 452 may further include a multilayer structure comprising multiple dielectric materials. Preferably, the dielectric material will have relatively high integrity and low current leakage. In the present embodiment, the gate dielectric layer 422 and the dielectric layer 452 comprise a high-K dielectric material. The high k material may be selected from metal oxides, metal nitrides, metal silicates, transition metal-oxides, transition metal-nitrides, transition metal-silicates, oxynitrides of metals, metal aluminates, zirconium silicate, zirconium aluminate, $HfO_2$, and/or combinations thereof. Examples of the dielectric material further include silicon oxide, silicon nitride, silicon oxynitride, hafnium oxide, zirconium oxide, titanium oxide, aluminum oxide, hafnium dioxide-alumina ($HfO_2$—$Al_2O_3$) alloy, other suitable high-K dielectric materials, and/or combinations thereof. In some embodiments, the gate dielectric layer 422 and the dielectric layer 452 may comprise a layer of silicon dioxide and a layer of high-K dielectric material. Further, the dielectric layers 422, 452 may be doped polycrystalline silicon with the same or different doping. The dielectric layers 422, 452 may be formed using chemical vapor deposition (CVD), physical vapor deposition (PVD), atomic layer deposition (ALD), thermal oxide, plating, other suitable processes, and/or combinations thereof.

The gate electrode comprising the first gate layer 424 and the second gate layer 426 is disposed over the gate dielectric layer 422. The electrode comprising the first layer 454 and the second layer 456 is disposed over the dielectric layer 452. The gate electrode and electrode may comprise polycrystalline silicon; silicon-containing materials; germanium-containing materials; metal, such as aluminum, copper, tungsten, titanium, tantulum, titanium nitride, tantalum nitride, nickel silicide, cobalt silicide; other proper conductive materials; and combinations thereof. In the present embodiment, the first gate layer 424 and the first layer 454 comprise metal, such as aluminum, copper, tungsten, titanium, tantulum, titanium nitride, tantalum nitride, nickel silicide, cobalt silicide; and the second gate layer 426 and the second layer 456 comprise polycrystalline silicon (i.e., polysilicon). It is understood that in alternate embodiments, the first gate layer 424, first layer 454, second gate layer 426, and second layer 456 may comprise other suitable materials and may comprise multilayer structures. The gate electrode and electrode may be formed by CVD, PVD, ALD, thermal oxide, plating, other suitable processes, and/or combinations thereof.

The gate spacers 428, which are positioned on each side of the gate structure 420, and the spacers 458, which are positioned on each side of the resistive structure 450, may comprise a dielectric material such as silicon nitride, silicon oxide, silicon carbide, silicon oxynitride, other suitable materials, or combinations thereof. In some embodiments, the gate spacers 428 and spacers 458 may comprise a multilayer structure. The spacers 428, 458 may be formed by depositing the dielectric material by CVD, ALD, PVD, and/or other suitable processes and then etching.

As noted above, the gate structure 420 and the resistive structure 450 may be formed simultaneously. In some embodiments, a dielectric layer and electrode layer may be formed on the semiconductor substrate and isolation region and then patterned to form a plurality of gate structures and resistive structures using processes including photolithography patterning and etching. In one example, for patterning the dielectric layers and the electrode layers, a layer of photoresist is formed on the electrode layers by a suitable process, such as spin-on coating, and then patterned to form a patterned photoresist feature by a proper lithography patterning method. The pattern of the photoresist can then be transferred by a dry etching process to the underlying dielectric layers and electrode layers to form the electrode layers and dielectric layers of the gate structure and resistive structure as shown in FIG. 15. The photoresist layer may be stripped thereafter. In another example, a hard mask layer is formed on the electrode layers; the patterned photoresist layer is formed on the hard mask layer; the pattern of the photoresist layer is transferred to the hard mask layer and then transferred to the electrode layers to form the electrode layers and dielectric layers of the gate structure and resistive structure. It is understood that the above examples do not limit the processing steps that may be utilized to form the gate structure 420 and the resistive structure 450.

In the present embodiment, the hard mask layers 430, 460 are disposed over the gate electrode 426 and the second layer 456, respectively. In the present embodiment, the hard mask layers 430, 460 comprise a nitrogen-containing material, such as silicon nitride, silicon oxynitride, other suitable nitrogen-containing materials, and/or combinations thereof. In alternate embodiments, the hard mask layers may include an amorphous carbon material, silicon carbide, other suitable dielectric materials, and/or combinations thereof. The hard mask layers 430, 460 may be formed by any suitable process, such as PVD, CVD, plasma-enhanced CVD, rapid thermal CVD, ALD, metal-organic CVD, other suitable processes, and/or combinations thereof. The hard mask layers 430, 460 may include a single layer or multiple layers. Further, the hard mask layers 430, 460 comprise any suitable thickness. In the present embodiment, the hard mask layers 430, 460 comprise a thickness of approximately 200 Å to 1000 Å. It is understood that the hard mask layers 430, 460 may comprise similar or different compositions, thicknesses, etc.

The lightly doped regions 440, 442 (also referred to as LDD regions) are formed in the semiconductor substrate 410 after the formation of the gate spacers 428. The LDD regions 440, 442 may be doped n-type and/or p-type and may comprise various doping profiles. The LDD regions 440, 442 are formed by any suitable process such as ion implantation.

Figure 16:
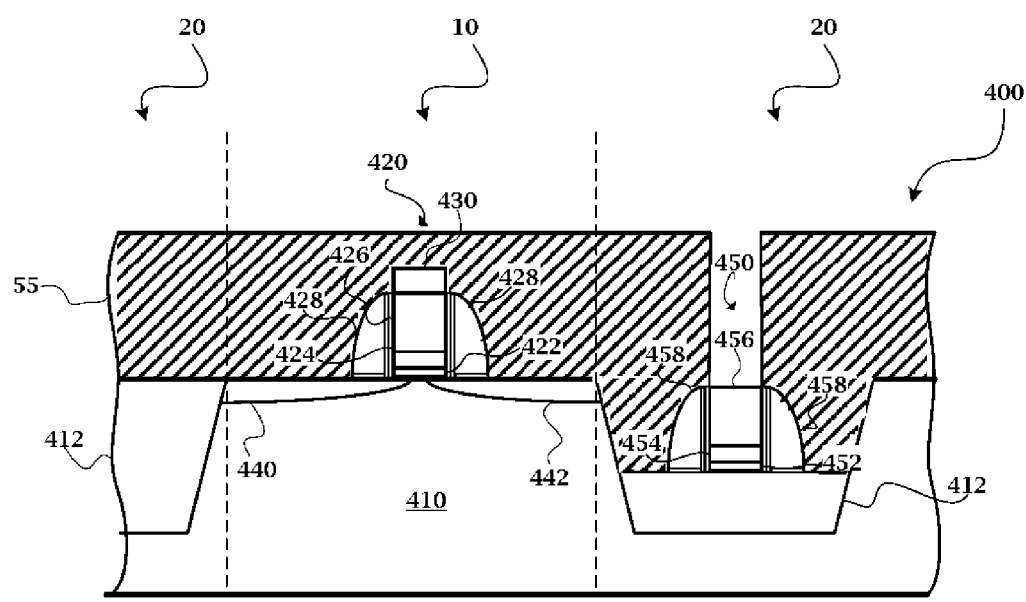

Referring to FIGS. 12 and 16, at step 310, the hard mask layer 460 disposed over the resistive structure 450 is removed. The hard mask layer 460 may be removed by any suitable process. For example, as illustrated in FIG. 16, removing the hard mask layer 460 may include forming a photoresist layer 55 over the semiconductor device 400; patterning the photoresist layer 55 by a conventional photolithography process; and etching the photoresist layer 55 to remove the hard mask layer 460. Subsequently, the photoresist layer 55 may be removed.

Figure 17A:
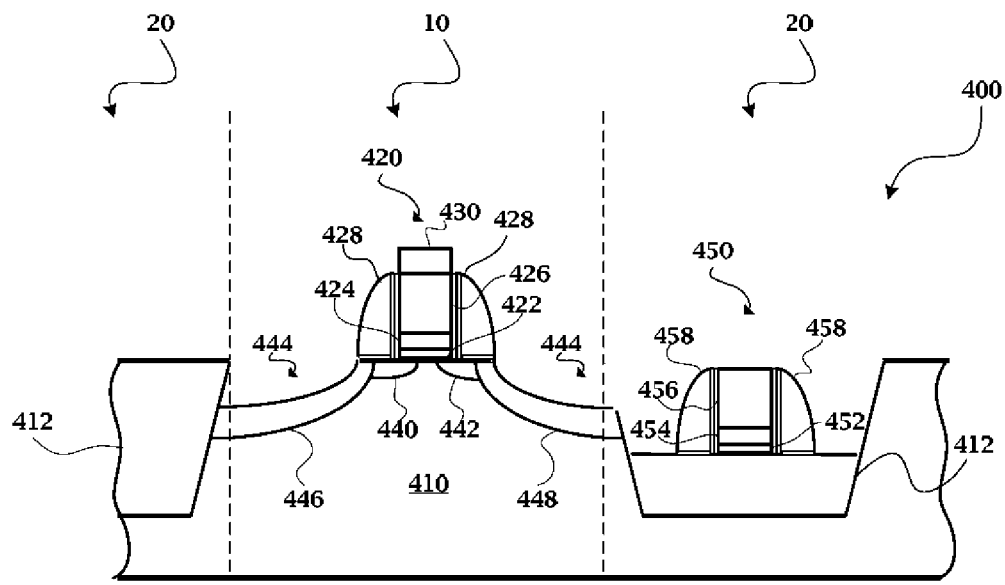
Figure 17B:
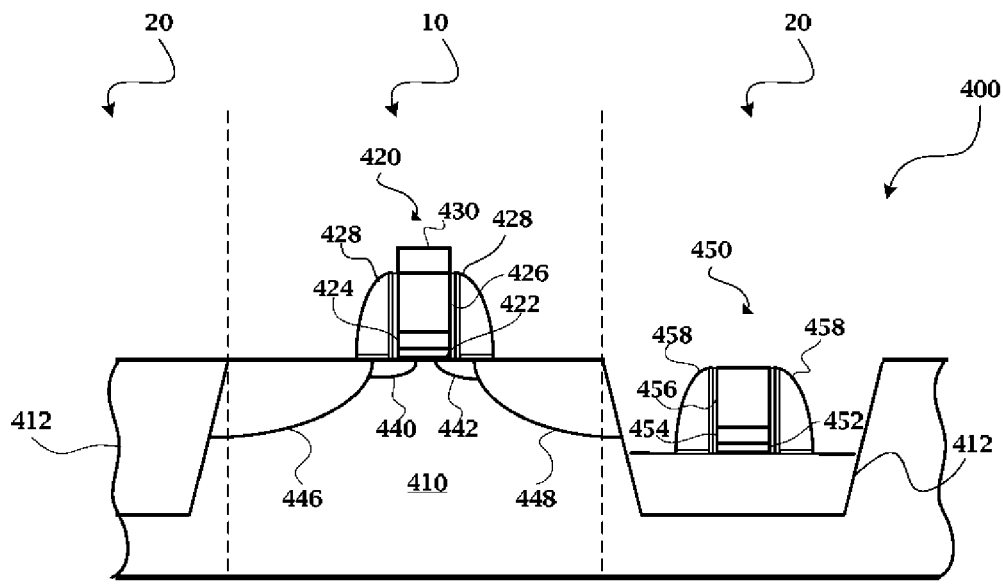

Referring to FIGS. 12 and 17A, at step 312, doped regions 446, 448 are formed and the electrode of the resistive structure 450 comprising the first layer 454 and second layer 456 is doped. The doped regions 446, 448 may be doped with p-type or n-type dopants. For example, the doped regions 446, 448 may be doped with p-type dopants, such as boron or $BF_2$. Alternatively, the doped regions 446, 448 may be doped with n-type dopants, such as phosphorus or arsenic. The doped regions 446, 448 may include a source and drain region. The source and drain regions may be formed directly on the semiconductor substrate 410, in a P-well structure, in a N-well structure, in a dual-well structure, or using a raised structure. The source and drain regions may comprise various doping profiles and may be formed by a plurality of ion implantation processes. Alternate embodiments may have only one doped region or multiple doped regions. The doped regions 446, 448 are formed by any suitable process, such as ion implantation and/or a rapid thermal process (RTP) to activate the doped regions. In the present embodiment, a recess 444 is formed in the doped regions 446, 448, wherein the doped regions 446, 448 are recessed from a top surface of the semiconductor substrate 410. The recess 444 may be formed by any suitable process. In some embodiments, the recess 444 is a distance from a top surface of the semiconductor substrate 410 to a top surface of the doped regions 446, 448. In one example, the distance from the top surface of the semiconductor substrate of the semiconductor substrate 410 and the top surface of the doped regions 446, 448 is at least 250 Å. It is understood that in some embodiments, as illustrated in FIG. 17B, the doped regions 446, 448 may not include recess 444, making the top surface of the semiconductor substrate 410 level with the top surface of the doped regions 446, 448.

Also, at step 312, the resistive structure 450, particularly the electrode of the resistive structure 450 including the first layer 454 and the second layer 456 is doped. The electrode may be doped with p-type or n-type dopants. For example, the electrode may be doped with p-type dopants, such as boron or $BF_2$. Alternatively, the electrode may be doped with n-type dopants, such as phosphorus or arsenic. In some embodiments, the resistive structure 450 may comprise doped polysilicon. In some embodiments, the resistive structure 450 may comprise doped amorphous silicon. The electrode of the resistive structure 450 may be doped by any suitable process including in-situ doping and/or ion implantation. In one example, the electrode may be doped while forming the doped regions 446, 448, such as performing a simultaneous ion implantation process. In other examples, the electrode may be doped independently from the doped regions 446, 448, such as independent photolithography patterning and etching processes to form the electrode and the doped regions 446, 448. Doping the electrode of the resistive structure 450 independently may provide more flexibility in tuning the resistivity of the resistive structure 450.

Figure 18:
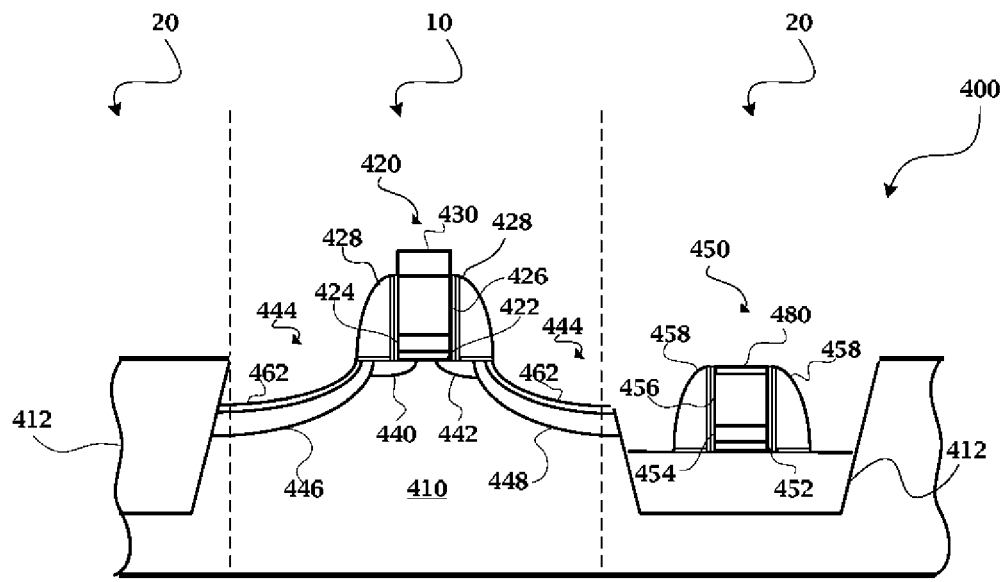

Referring to FIGS. 12 and 18, at step 314, a silicide is formed in the doped regions 446, 448 and the resistive structure 450 to form doped silicide regions 462 and 480. The silicide may also be formed in the gate structure 420 to form a gate silicide region. The silicide regions 462, 480 may comprise materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The materials utilized to create the silicide may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof. After deposition, the salicidation process may continue with a reaction between the deposited material and the doped regions at an elevated temperature that is selected based on the specific material or materials. This is also referred to as annealing, which may include a rapid thermal annealing process (RTP). The reacted silicide may require a one step RTP or multiple step RTPs.

Figure 19:
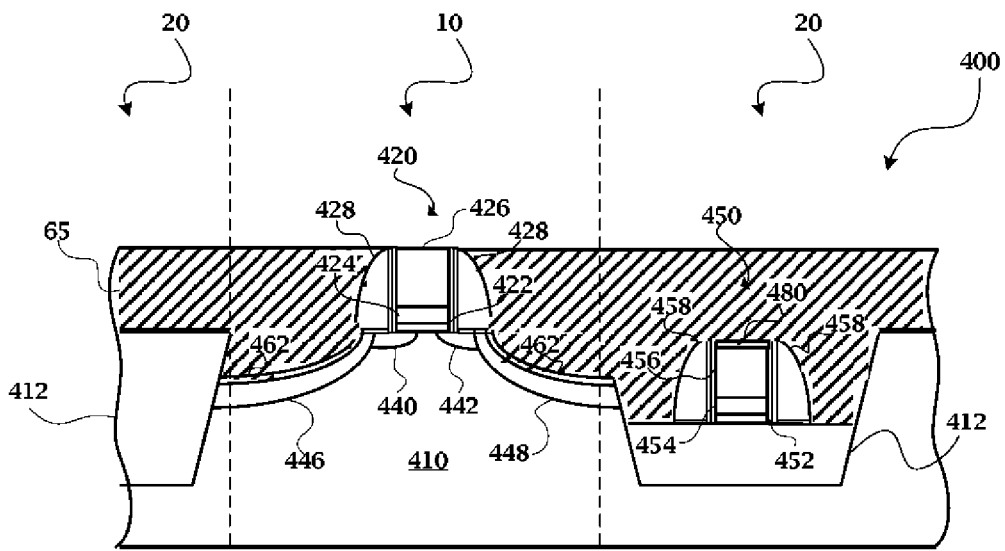

FIGS. 12 and 19 illustrate step 316, wherein the hard mask layer 430 is removed from the gate structure 420. It is understood that step 316 may occur before or after the salicidation process, depending on whether a silicide region needs to be formed in the gate structure 420. The hard mask layer 430 may be removed by any suitable process. For example, as illustrated in FIG. 19, removing the hard mask layer 430 may include forming a photoresist layer 65 over the semiconductor device 400; patterning the photoresist layer 65 by a conventional photolithography process; and etching the photoresist layer 65 to remove the hard mask layer 430. Subsequently, the photoresist layer 65 may be removed as illustrated in FIG. 20 and the semiconductor device 400 may be exposed to subsequent processing. FIGS. 21A and 21B provide top view of various embodiments of the resistive structure, wherein the resistive structure comprises an eFuse.

The method 300 and semiconductor device 400, as illustrated in FIG. 20, provide a resistive structure 450 comprising a novel polysilicon eFuse for replacement gate technology. Such resistive structure, lying in a substantially different plane than the gate structure, provides a resistive structure with increased resistivity, lower overhead area, and improved lower programming voltage. In some embodiments, the resistive structure 450 may act as a local interconnect.

Overall, the disclosed embodiments provide on or more of the following advantages: (1) fully compatible with present processes by porting the resistive structure directly and easily; (2) the resistive structure leaves a small foot-print (i.e., the resistive structure has a higher resistivity resulting in a smaller area); (2) small variation; (3) better linearity (e.g., small temperature and voltage coefficients); (4) small mismatch; (5) the benefits in variation, linearity, and mismatch also lead to smaller die size; (6) reduced noise coupling, the resistive structures disposed over the isolation regions result in very low coupling capacitance; (7) an additional masking layer is needed; (8) higher applicable frequency (e.g., the resistive structure virtually forms a RC ladder with lower cutoff frequency); (8) impedance and capacitance matching concerns are eliminated; and (9) lower programming voltages. It is understood that steps and features from methods 100, 300 and semiconductor devices 200, 400 may be utilized interchangeably to provide various methods and semiconductor devices in order to obtain any of the above advantages.

In summary, a semiconductor device and method is provided that includes a resistive structure that remedies the issues addressed above. In one embodiment, a semiconductor device comprises a semiconductor substrate; an active region of the substrate, wherein the active region includes at least one transistor; and a passive region of the substrate, wherein the passive region includes at least one resistive structure disposed on an isolation region, the at least one resistive structure in a lower plane than the at least one transistor. The semiconductor device may further comprise a polish stop layer disposed over the semiconductor substrate between the at least one transistor and the at least one resistive structure.

In some embodiments, the isolation region comprises a shallow trench isolation (STI). A distance between a top surface of the isolation region and a top surface of the semiconductor substrate may be between approximately 200 Å and 2000 Å. A distance between a top surface of the at least one resistive structure and a top surface of the at least one transistor may be at least 250 Å.

In some embodiments, the at least one transistor comprises a metal gate transistor. In some embodiments, the at least one resistive structure comprises at least one of a resistor or an e-Fuse. In some embodiments, the at least one resistive structure comprises silicon. In some embodiments, the at least one resistive structure comprises at least one of a discrete resistor or a discrete e-Fuse, at least one of a resistor array or an e-Fuse array, and/or combinations thereof. In some embodiments, the at least one resistive structure comprises a shape including at least one of a line, dog bone, or rectangle. The at least one resistive structure may comprises at least one of doped polysilicon or doped amorphous silicon. Also, the at least one resistive structure may be doped by at least one of in-situ or ion implantation.

In one embodiment, a semiconductor device comprises a semiconductor substrate; an active region of the substrate, wherein the active region includes at least one transistor; and a passive region of the substrate, wherein the passive region includes at least one resistive structure disposed on an isolation region, the isolation region having a concave surface. The at least one resistive structure may be in a lower plane than the at least one transistor. Further, the semiconductor device may comprise a polish stop layer disposed over the semiconductor substrate between the at least one transistor and the at least one resistive structure. A distance between a top surface of the at least one resistive structure and a top surface of the at least one transistor may be at least 250 Å.

In some embodiments, the at least one transistor comprises a metal gate transistor. In some embodiments, the at least one resistive structure comprises at least one of a silicon resistor or a silicon e-Fuse. In some embodiments, the at least one resistive structure comprises at least one of a discrete resistor or a discrete e-Fuse, a resistor array or an e-Fuse array, and/or combinations thereof. In some embodiments, the at least one resistive structure comprises a shape including at least one of a line, dog bone, or rectangle. The at least one resistive structure may comprise at least one of doped polysilicon or doped amorphous silicon. Also, the at least one resistive structure may be doped by at least one of in-situ or ion implantation.

In another embodiment, a semiconductor device comprises a semiconductor substrate including at least one active region and at least one passive region; a gate structure disposed over the semiconductor substrate within the at least one active region; and a resistive structure disposed over an isolation region on the semiconductor substrate within the at least one passive region, wherein the resistive structure is in a lower plane than the gate structure. The semiconductor device may further comprise at least one doped region adjacent each side of the gate structure, the at least one doped region including a recess, wherein there is a distance between a top surface of the semiconductor substrate and a top surface of the at least one doped region; and a silicide region in the at least one doped region. Also, in some embodiments, the semiconductor device further comprises a polish stop layer that overlies the semiconductor device between the gate structure and the resistive structure.

In some embodiments, the isolation region includes a recess, wherein a top surface of the gate structure is higher than a top surface of the resistive structure. In some embodiments, a protective layer overlies the resistive structure. The protective layer may prevent the resistive structure from being exposed to a salicidation process and forming a silicide region in the resistive structure. The protective layer may comprise a resist protective oxide. In some embodiments, the resist protective oxide including at least one of silicon oxide or silicon nitride. In some embodiments, the resist protective oxide comprises a thickness between approximately 300 Å and 1500 Å.

In one embodiment, a method for forming a semiconductor device comprises providing a semiconductor substrate; forming at least one gate structure over the semiconductor substrate and at least one resistive structure over an isolation region on the semiconductor substrate, wherein the resistive structure lies in a lower plane than the gate structure; forming at least one doped region in the semiconductor substrate; and forming a silicide in the at least one doped region. The method may further comprise forming a protection layer over the resistive structure before forming the silicide in the at least one doped region. In some embodiments, the method further comprises forming a recess in the isolation region, and/or forming a recess in the at least one doped region prior to forming a silicide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming an isolation region on a substrate, wherein the isolation region extends a depth into the substrate from a substrate surface;
    forming a recess in the isolation region, wherein the recess is defined by a concave surface of the isolation region;
    forming a first gate structure over the substrate surface and a second gate structure over the concave surface of the isolation region, wherein forming the first gate structure comprises forming a first gate stack over the substrate surface and a second gate stack over the concave surface of the isolation region, wherein a topmost layer of the first and second gate stacks is a hard mask layer;

removing the hard mask layer from the second gate stack; and forming a first doped region and a second doped region in the substrate, wherein the first gate stack interposes the first doped region and the second doped region.

2. The method of claim 1 wherein the forming the first doped region and the second doped region in the substrate includes doping the second gate stack.

3. The method of claim 1 wherein the forming the first doped region and the second doped region in the substrate includes:

forming a recess in the substrate, wherein the recess is defined by a recessed surface of the substrate; and performing an implantation process to form the first doped region and the second doped region in the substrate along the recessed surface.

4. The method of claim 1 further including:

forming a protection layer over the second gate stack; and thereafter, forming a silicide feature in the first doped region and the second doped region.

5. The method of claim 4 further including removing the hard mask layer from the first gate stack after forming the silicide feature in the first doped region and the second doped region.

6. The method of claim 4 wherein the forming the protection layer over the second gate stack includes forming a resist protect oxide (RPO) layer over the second gate stack.

7. The method of claim 1 wherein the forming the first gate structure over the substrate surface and the second gate structure over the concave surface of the isolation region includes:

forming a metal gate transistor over the substrate surface; and forming a resistive structure over the concave surface of the isolation region.

8. The method of claim 1 wherein the forming the recess in the isolation region, the recess being defined by the concave surface of the isolation region, includes etching the isolation region until a distance (d) between the substrate surface and a bottommost portion of the concave surface is about 10% of the depth (T) of the isolation region to about 70% of the depth (T) of the isolation region ($0.10T < d < 0.70T$).

9. A method comprising:

forming an isolation region on a substrate having a substrate surface, wherein the isolation region has an isolation region surface that is in a plane lower than the substrate surface;

thereafter, forming a first gate structure over the substrate surface and a second gate structure over the isolation region surface, wherein the first gate structure and the second gate structure include a hard mask layer;

thereafter, removing the hard mask layer from the second gate structure;

thereafter, forming a source region and a drain region in the substrate, wherein the first gate structure interposes the source region and the drain region;

thereafter, forming a protection layer over the second gate structure;

thereafter, forming a silicide feature on the source region and the drain region;

thereafter, removing the hard mask layer from the first gate structure.

10. The method of claim 9 wherein the forming the isolation region on the substrate having the substrate surface, wherein the isolation region has the isolation region surface that is in a plane lower than the substrate surface, includes etching the isolation region to form a recess in the isolation region, wherein the recess is defined by a concave surface.

11. The method of claim 9 wherein:

the forming the first gate structure includes forming a first gate stack having a first gate stack that includes a gate dielectric layer disposed over the substrate, a gate electrode layer disposed over the gate dielectric layer, and the hard mask layer disposed over the gate electrode layer; and the forming the second gate structure includes forming a second gate stack having a second gate stack that includes the gate dielectric layer disposed over the substrate, the gate electrode layer disposed over the gate dielectric layer, and the hard mask layer disposed over the gate electrode layer.

12. The method of claim 11:

wherein the gate electrode layer includes a polysilicon layer; and the forming the source region and the drain region in the substrate includes simultaneously doping the polysilicon layer of the second gate stack.

13. The method of claim 12 further including, after removing the hard mask layer from the first gate structure, replacing the polysilicon layer of the first gate stack with a metal layer.

14. The method of claim 11 further including, after removing the hard mask layer from the first gate structure, replacing a polysilicon gate electrode of the first gate structure with a metal gate electrode.

15. The method of claim 11 wherein the forming the source region and the drain region in the substrate, wherein the first gate structure interposes the source region and the drain region, includes:

forming a recess in the substrate, wherein the recess is defined by a recessed surface of the substrate that is in a plane lower than the substrate surface; and performing an implantation process to form the source region and the drain region in the substrate along the recessed surface.

16. A method comprising:

providing a semiconductor substrate;

forming a shallow trench isolation in the semiconductor substrate;

etching the shallow trench isolation such that the shallow trench isolation has a concave surface that is in a plane lower than a surface of the semiconductor substrate;

forming a resistive structure over the concave surface of the shallow trench isolation; and performing a salicidation process, wherein the resistive structure is protected during the salicidation process.

17. The method of claim 16 further including simultaneously a gate structure over the surface of the semiconductor substrate while forming the resistive structure.

18. The method of claim 17 wherein the performing the salicidation process, wherein the resistive structure is protected during the salicidation process, includes:

forming a silicide feature in a source region and a drain region, the source region and the drain region being interposed by the gate structure; and forming a resist protection oxide layer over the resistive structure before forming the silicide feature.

* * * * *